United States Patent [19]
Dekker et al.

[11] Patent Number: 6,046,493
[45] Date of Patent: *Apr. 4, 2000

[54] SEMICONDUCTOR DEVICE WITH SPECIAL EMITTER CONNECTION

[75] Inventors: Ronald Dekker; Ronald Koster, both of Eindhoven, Netherlands

[73] Assignee: U.S. Philips Corporation, New York, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/887,980

[22] Filed: Jul. 3, 1997

[30] Foreign Application Priority Data

Jul. 3, 1996 [EP] European Pat. Off. ............ 962018222

[51] Int. Cl.$^7$ ...................... H01L 27/082; H01L 27/102; H01L 29/70
[52] U.S. Cl. .......................... 257/579; 257/587; 257/578
[58] Field of Search .................................. 257/587, 578, 257/579, 580, 582

[56] References Cited

U.S. PATENT DOCUMENTS

| | | | |
|---|---|---|---|
| 4,656,496 | 4/1987 | Widlar | 357/36 |
| 5,414,296 | 5/1995 | Bartlow | 257/579 |
| 5,569,952 | 10/1996 | Dekker et al. | 257/579 |

FOREIGN PATENT DOCUMENTS

| | | | |
|---|---|---|---|
| 58-158965 | 9/1983 | Japan | 257/587 |
| 62-269360 | 11/1987 | Japan | 257/579 |

Primary Examiner—Steven H. Loke

[57] ABSTRACT

A semiconductor device provided with a semiconductor substrate with a bipolar transistor having a collector region of a first conductivity type, a base region adjoining the collector region and of a second conductivity type opposed to the first, and an elongate emitter region of the first conductivity type adjoining the base region; the collector region, the base region, and the emitter region being provided with conductor tracks which are connected to conductive connection surfaces. The conductor track on the elongate emitter region of the semiconductor device has a connection to a connection surface for a further electrical connection at each of the two ends of the emitter region. The emitter region may be made longer in this manner because the length of the emitter region is effectively halved by the connections at the two ends. Consequently, charge carriers need be transported over no more than at most half the emitter length. The semiconductor device according to the invention is thus capable of supplying high powers because the charge transport is not limited by charge transport through the conductor track on the elongate emitter region.

18 Claims, 12 Drawing Sheets

SEMICONDUCTOR DEVICE WITH SPECIAL EMITTER CONNECTION

BACKGROUND OF THE INVENTION

The invention relates to a semiconductor device provided with a semiconductor substrate with a bipolar transistor having a collector region of a first conductivity type, a base region adjoining the collector region and of a second conductivity type opposed to the first, and an elongate emitter region of the first conductivity type adjoining the base region, said collector, base, and emitter regions being provided with conductive tracks which are connected to conductive connection surfaces.

The English abstract of Japanese Patent Application 62-269360 discloses a device of the kind mentioned in the opening paragraph in which the substrate forms the collector region. The base and emitter regions are provided with so-called fingers, i.e. the base and emitter regions are each split up into a number of smaller regions which are electrically connected to one another and to the connection surfaces.

The known device described has the disadvantage that the transistor cannot easily supply comparatively high powers.

SUMMARY OF THE INVENTION

The invention has for its object inter alia to counteract the above disadvantage.

According to the invention, the device is for this purpose characterized in that the conductive track on the elongate emitter region has a connection to a connection surface for achieving a further electrical connection at each of the two ends of the emitter region. The elongate emitter regions are then connected at both longitudinal ends to connection surfaces for further electrical connections, such as bonding wires or so-called bumps. The bonding wires or bumps in that case connect the emitter of the bipolar transistor to, for example, a lead frame or printed circuit board. An elongate emitter is used in practice because the parasitic capacitances at the ends of the emitter region are minimized in the case of an elongate emitter. In addition, a given power can be accommodated in the most efficient manner by means of an elongate emitter region, given a certain available substrate surface area. The invention is based on the recognition that no high powers can be supplied by the known transistor because the maximum emitter length, and accordingly the maximum power which can be applied given a certain substrate surface area is limited by the transport of charge carriers through the conductive tracks on the elongate emitter. Restrictions relating to electromigration in the tracks play a part in this respect. Providing connections at both ends of the emitter region to respective connection surfaces for a further connection has the result that the emitter region can be made longer, because the two-sided connection of the emitter region effectively halves the length of the emitter region. Indeed, the charge carriers need be transported over at most half the emitter length now.

Preferably, the device according to the invention is characterized in that the collector region is connected to a connection surface which is present at a same side of the semiconductor substrate as the connection surfaces of the base and emitter regions, while the semiconductor substrate is of the same conductivity type as the base region. The substrate serves as the collector in the known transistor. This leads to a comparatively high capacitance of the base compared with the collector. This capacitance adversely affects the performance of the transistor. The device can then be given a final mounting on a lead frame with the substrate on an emitter lead. The bonding wires which connect the emitter connection surfaces to the emitter lead may be kept short in that case, which improves the transistor's performance. After final mounting, the base has a somewhat greater capacitance as compared with the emitter, but this capacitance has little influence on the performance.

An additional advantage is obtained when the semiconductor substrate is of rectangular shape, and an active region of the transistor is present along a diagonal of the rectangular substrate. The expression "active region" is here understood to mean that portion of a collector, emitter, and base region of the transistor through which a comparatively large portion of the current runs. The size of the active region may be maximized then. Preferably, connection surfaces for the emitter region are present on either side of the diagonal in this case. Comparatively much space is available then for these connection surfaces, while in addition the emitter bonding wires have little influence on one another.

Preferably, the device is characterized in that three or more connection surfaces for the emitter region are present. Current levels are high in modern bipolar transistors, which in combination with high operating frequencies has the result that the impedance formed by the self-induction in the emitter bonding wires has a strong influence on the transistor's behavior. The result of this is that a negative feedback effect will arise in the case of a small number of emitter bonding wires, and the high-frequency gain of the transistor will be reduced. A number of three or more connection surfaces for the emitter region renders it possible to provide three or more bonding wires for the electrical connection of the emitter region. Such a number of bonding wires leads to a low impedance of the bonding wires and good high-frequency properties. This number of connection surfaces is comparatively easy to provide owing to the diagonal placement of the active region. Three connection surfaces are sufficient for a transistor with a power of approximately 500 mW, and four connection wires are sufficient for a transistor with a power of approximately 1000 mW.

Preferably, the device according to the invention is characterized in that more than one connection surface for the collector region is present. More than one bonding wire for the collector may be used then, so that the performance of the transistor is not adversely affected by an excessive impedance in the collector connection in the case of comparatively strong currents through the collector.

An additional advantage is obtained when the device according to the invention is characterized in that the transistor is built up symmetrically along a diagonal of the rectangular substrate. Such a symmetrical arrangement of the device is favorable for the thermal stability of the transistor.

BRIEF DESCRIPTION OF THE DRAWINGS

The invention will be explained in more detail below, by way of example, with reference to drawings, in which.

The Figures are purely diagrammatic and not true to scale. Corresponding parts have generally been given the same reference numerals in the Figures.

DETAILED DESCRIPTION OF THE PREFERRED EMBODIMENT

Figure 1:
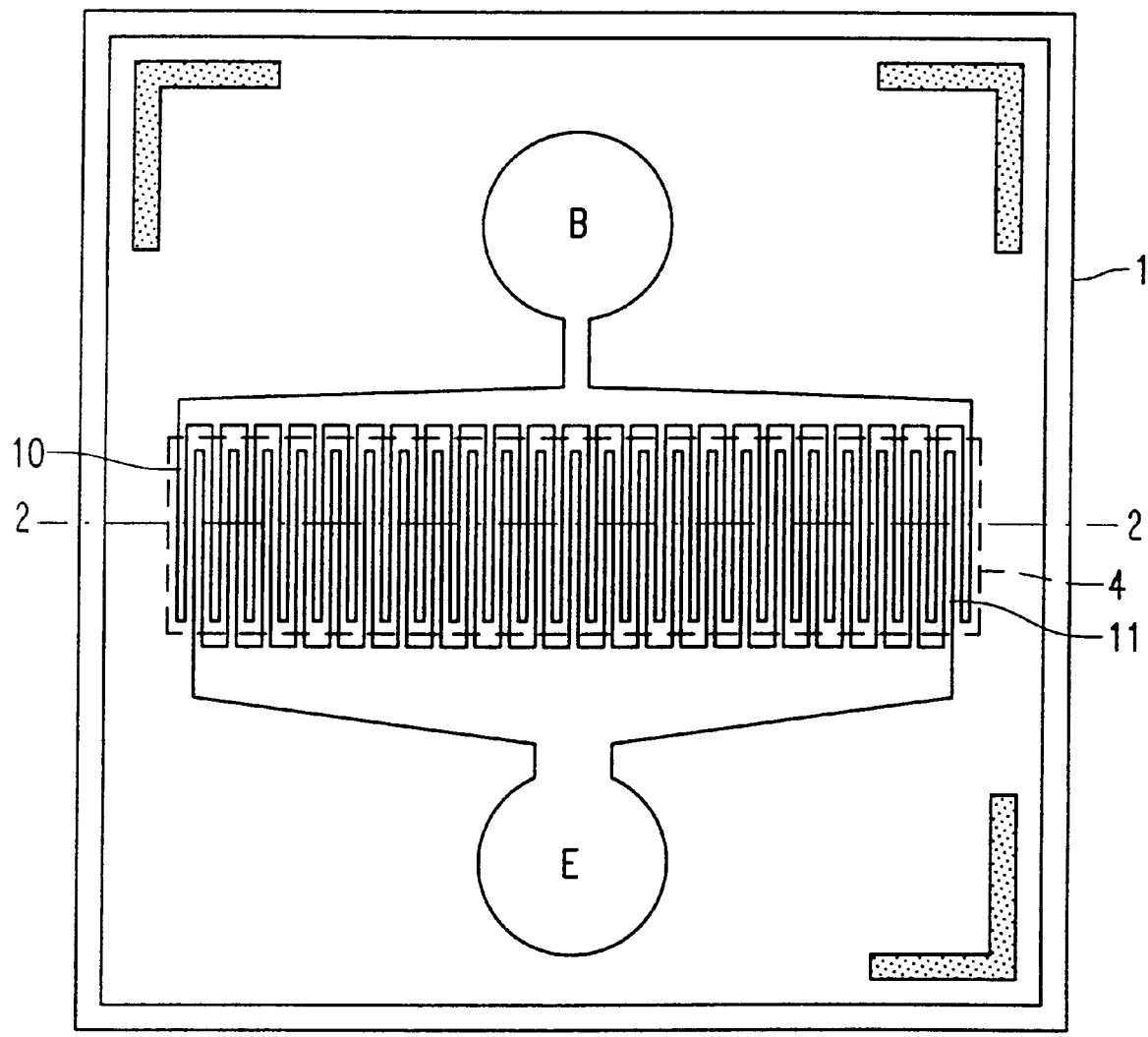
FIG. 1 is a plan view of a known semiconductor device.
Figure 2:
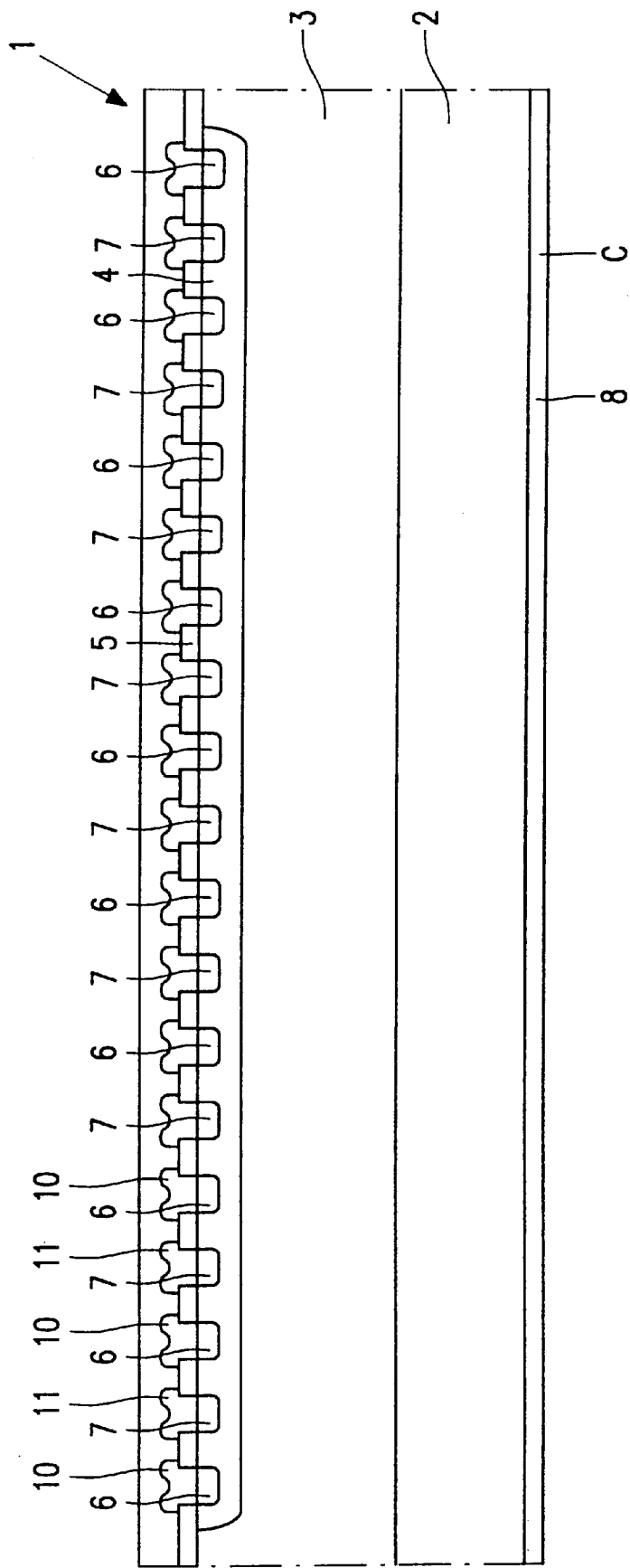
FIG. 2 is a cross-section taken on the line a-a' in FIG. 1 of a known semiconductor device.

FIG. 1 is a plan view and FIG. 2 a cross-section taken on the line a-a' of a known semiconductor device 1 provided with a semiconductor substrate 2 and comprising a bipolar transistor with a collector region 2, 3 of a first conductivity type. The substrate 2 in the known device is a strongly doped $n^+$-type silicon wafer. A more weakly doped $n^-$-type epitaxial layer 3 is provided on this substrate. A base region 4 of a second conductivity type opposed to the first, in this example a p-type, is provided so as to adjoin the collector region 3. This base region 4 adjoins the surface 5 in the present example. The circumference of the base region 4 is indicated with the dotted line in FIG. 1. The dotted line at the same time indicates the so-called active region of the transistor. The base region 4 is provided with an elongate, strongly doped $p^+$-type base contact region 6. The base contact region in this example is split up into a plurality of base contact regions 6. Adjoining the base region 4, there is an elongate emitter region 7 of the first conductivity type, in this example with an $n^+$-type doping. The emitter region in the present example is split up into a plurality of emitter regions 7. An elongate emitter region 7 is used in practice because the parasitic capacitances at the longitudinal end of the emitter region 7 can be minimized in the case of an elongate emitter region 7. The collector region 2, 3 is provided with a conductive layer 8 on a lower side of the substrate 1 which acts as a connection surface C. The base contact region 6 and the emitter region 7 are split up into a plurality of regions, the so-called fingers. The elongate base contact regions 6 and the elongate emitter regions 7 alternate with one another, such that the base contact regions 6 and the emitter regions 7 are connected by means of conductive tracks 10, 11 to conductive connection surfaces B, E, respectively. This known device as described has the disadvantage that the transistor cannot easily supply comparatively high powers given a certain substrate surface area. Thus it is not easy to increase the number or length of the fingers in the transistor shown in FIG. 1. Neither is it possible to provide an additional row of fingers.

Figure 3:
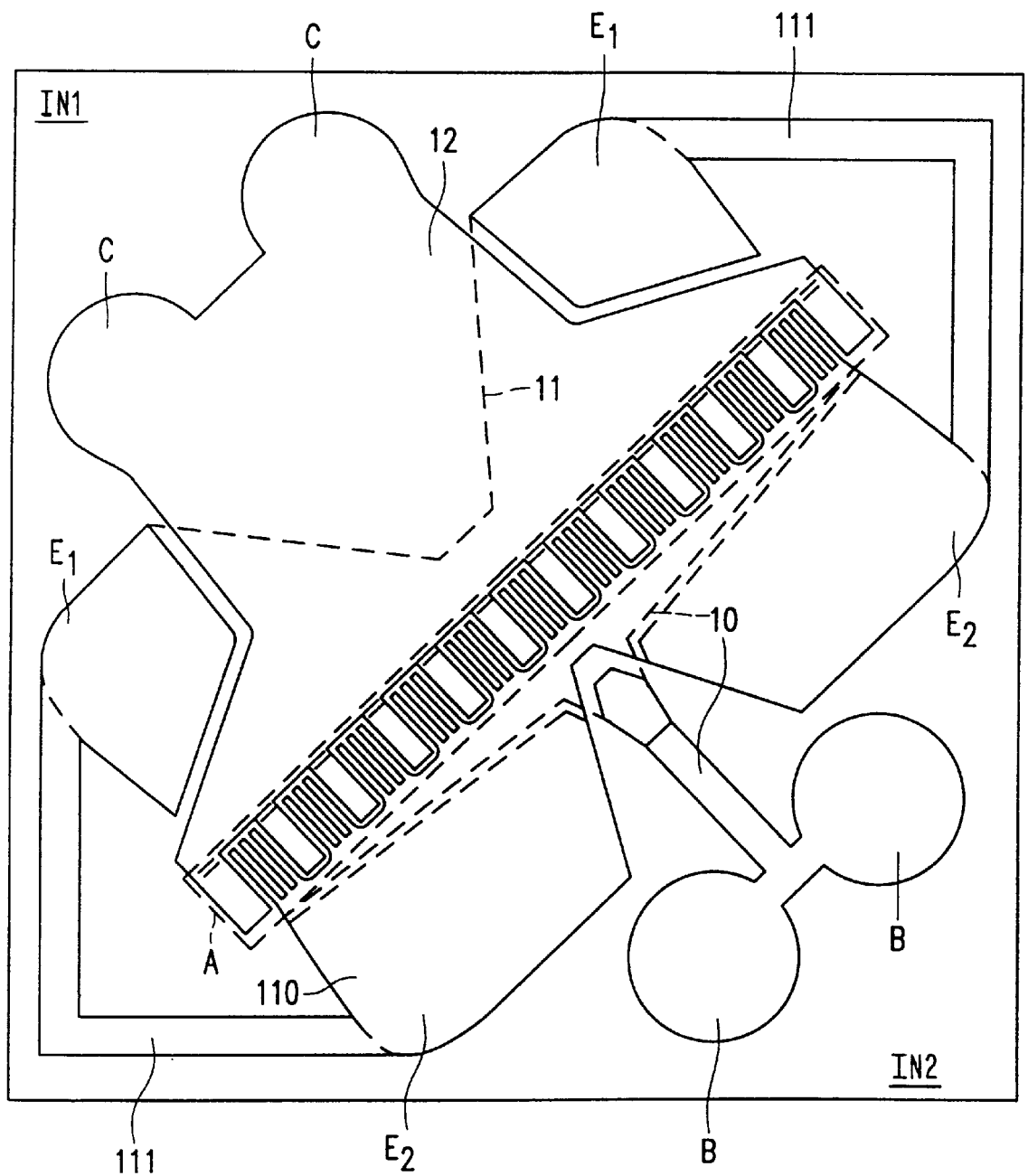
FIG. 3 is a plan view of a semiconductor device according to the invention.
Figure 4:
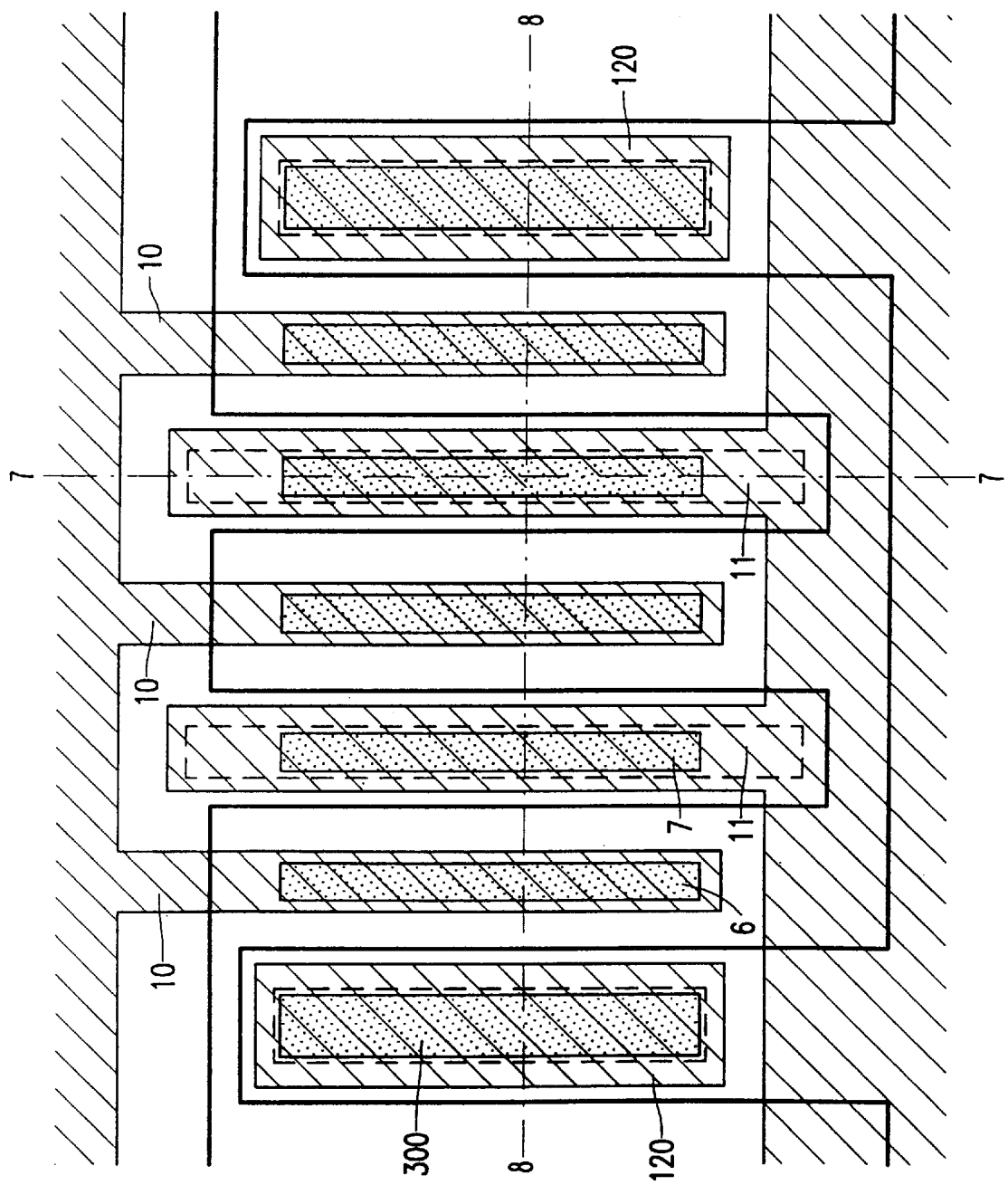
FIG. 4 is a detailed plan view of the region A indicated with a dotted line in FIG. 3, the first metal layer being shown hatched.
Figure 5:
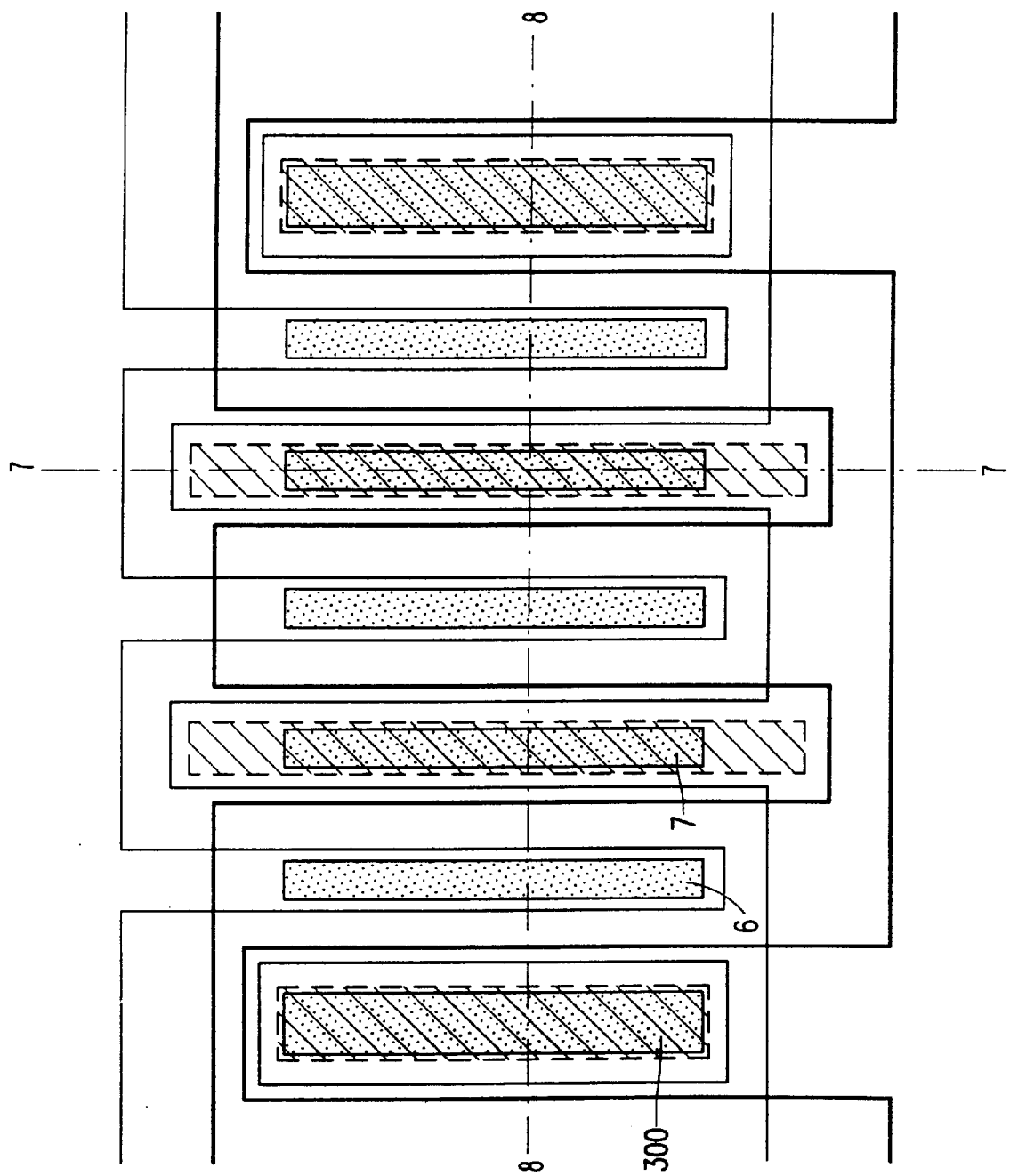
FIG. 5 is a detailed plan view of the region A indicated with a dotted line in FIG. 3, the contact holes (or vias) in the insulating layer between the first and the second metal layer being shown hatched.
Figure 6:
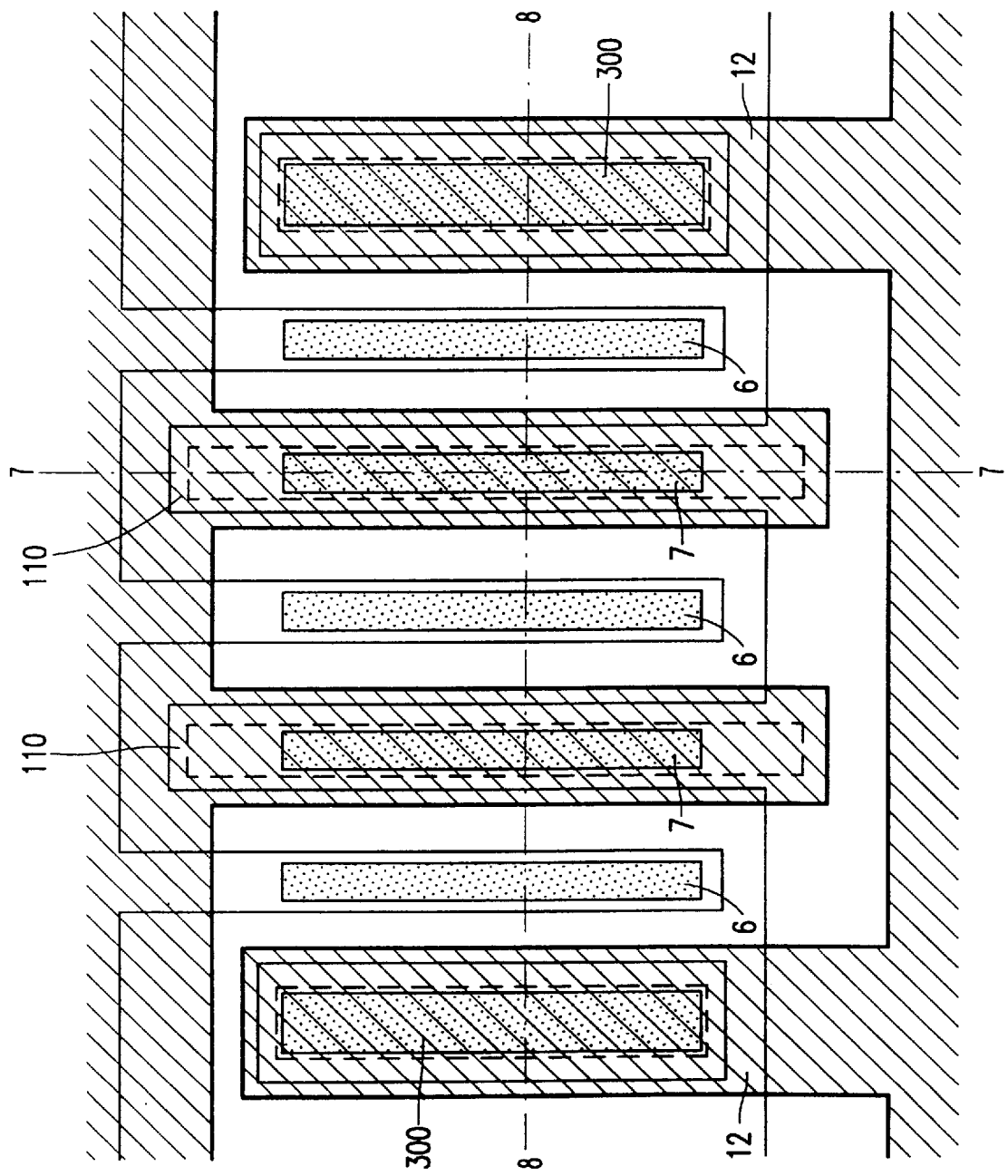
FIG. 6 is a detailed plan view of the region A indicated with a dotted line in FIG. 3 with the second metal layer shown hatched.
Figure 7:
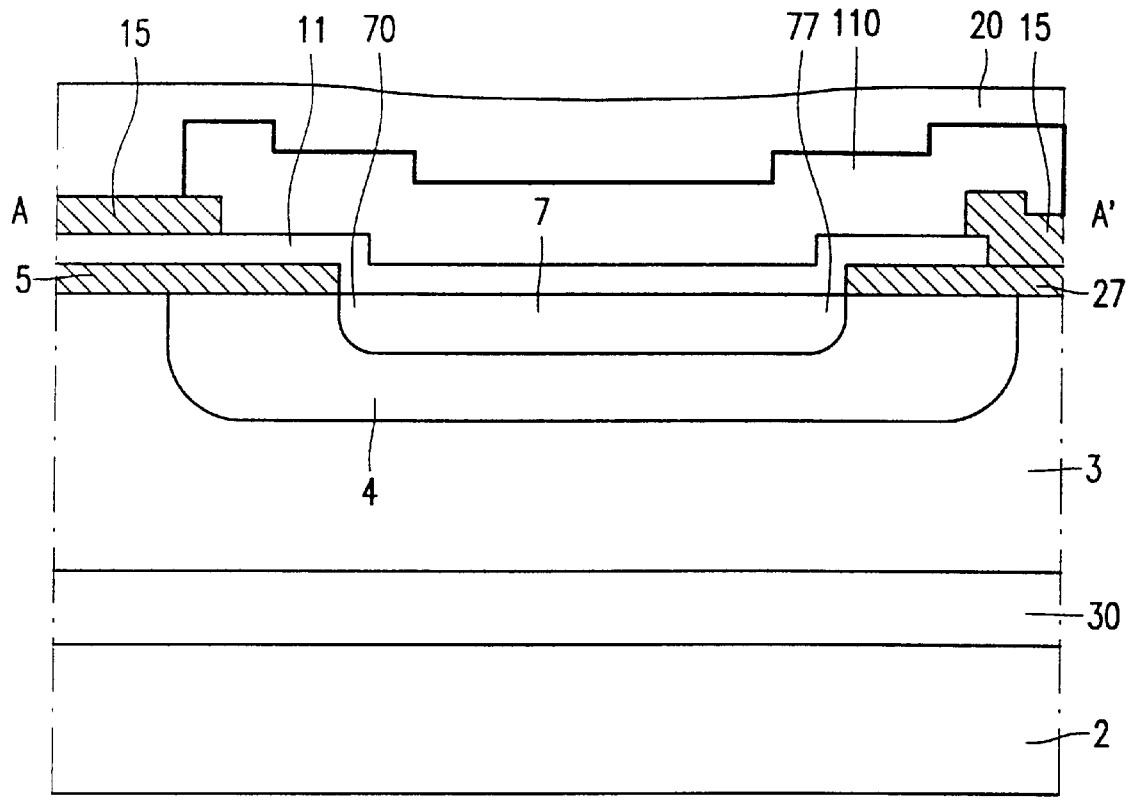
FIG. 7 is a cross-section taken on the line A-A' in FIGS. 4, 5, and 6.
Figure 8:
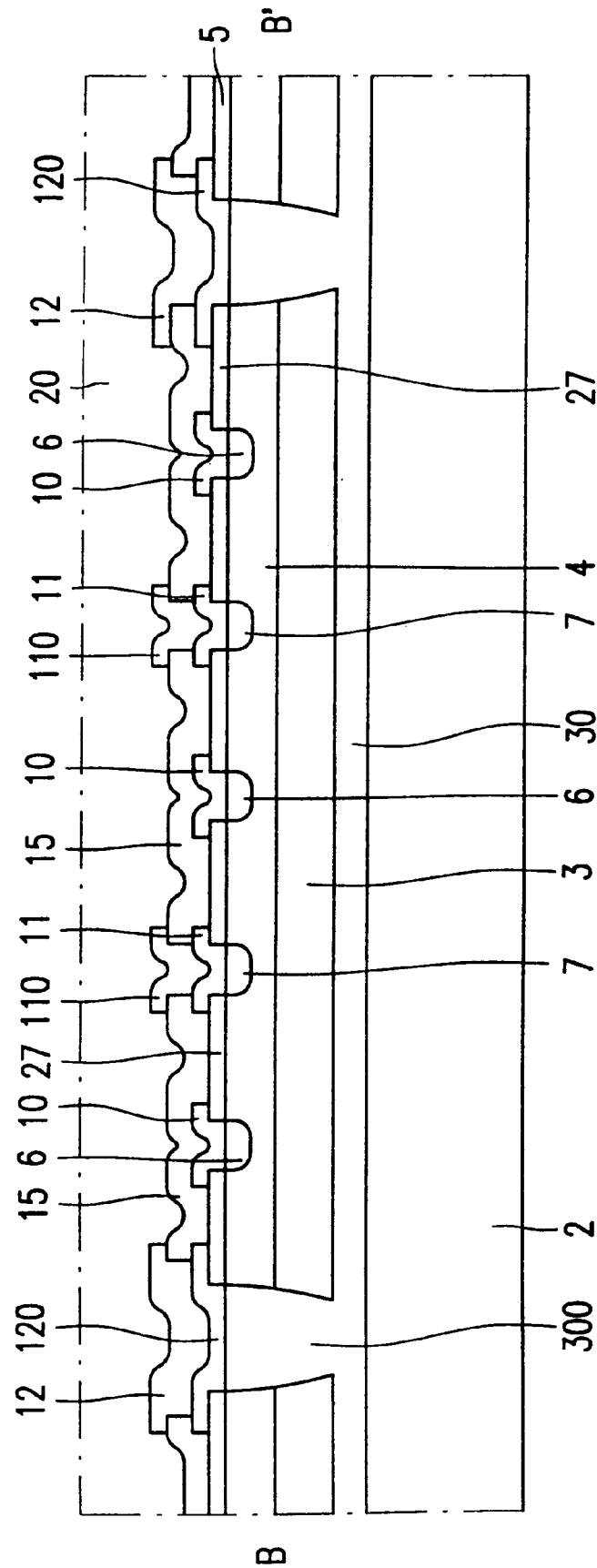
FIG. 8 is a cross-section taken on the line B-B' in FIGS. 4, 5, and 6.

FIG. 3 is a plan view, FIGS. 4, 5, and 6 show details from the plan view of FIG. 3, and FIGS. 7 and 8 are cross-sections taken on the lines A-A' and B-B' in FIGS. 4, 5, and 6 of a semiconductor device according to the invention.

Figure 9:
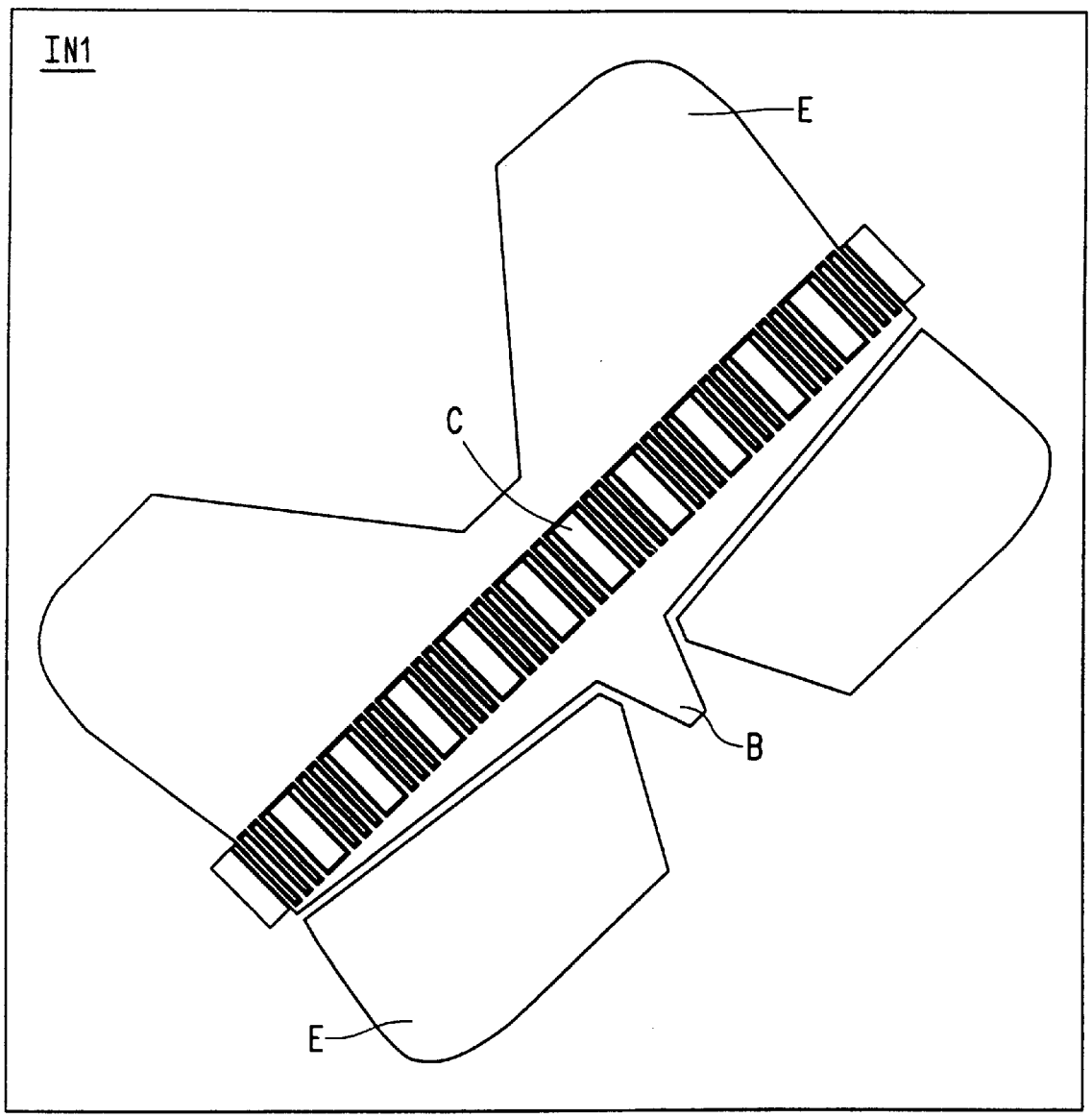
FIG. 9 is a plan view of the pattern of the first metal layer viewed as in FIG. 3.
Figure 10:
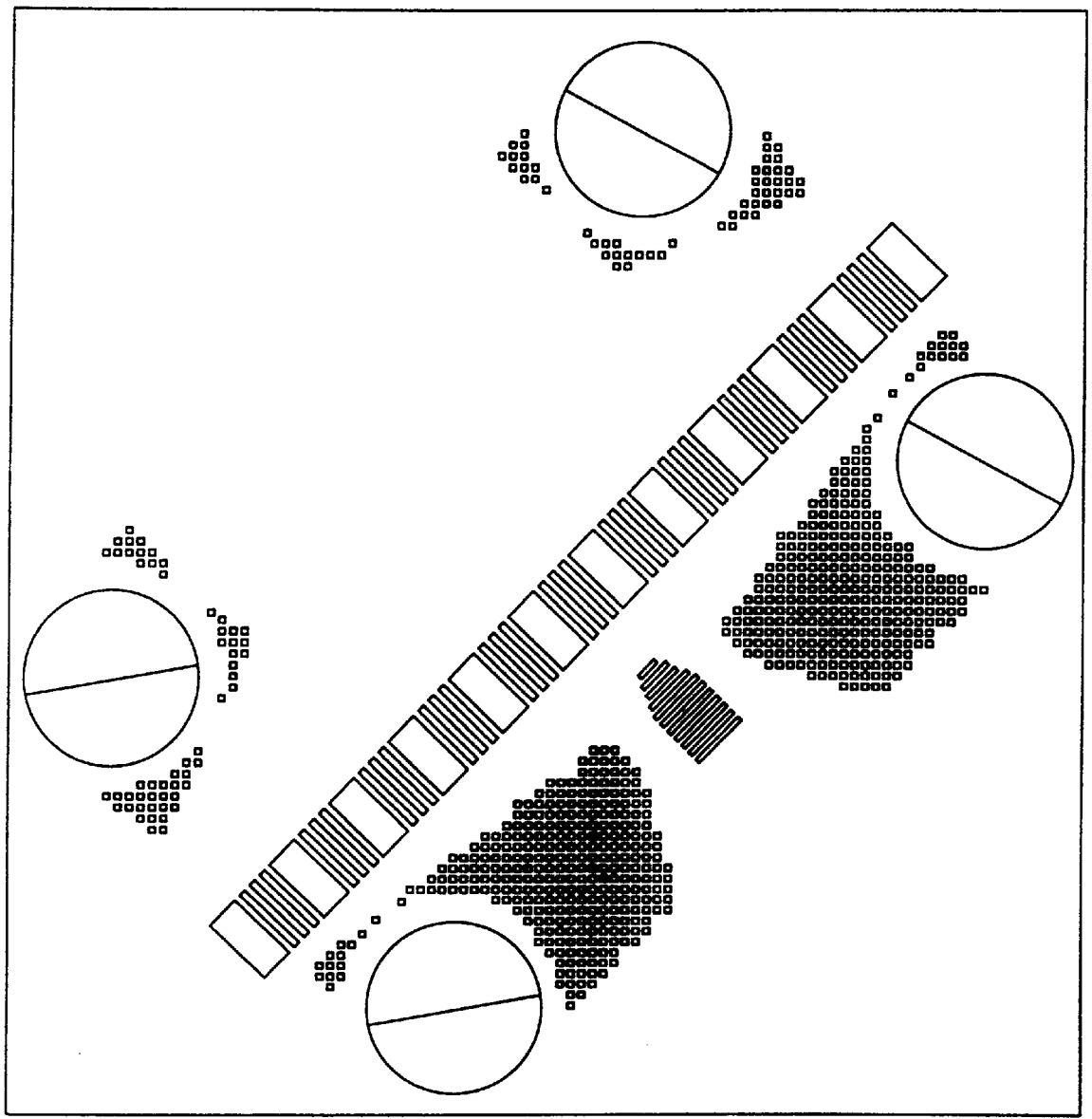
FIG. 10 is a plan view of the pattern of the vias in the insulating layer between the first and the second metal layer viewed as in FIG. 3.
Figure 11:
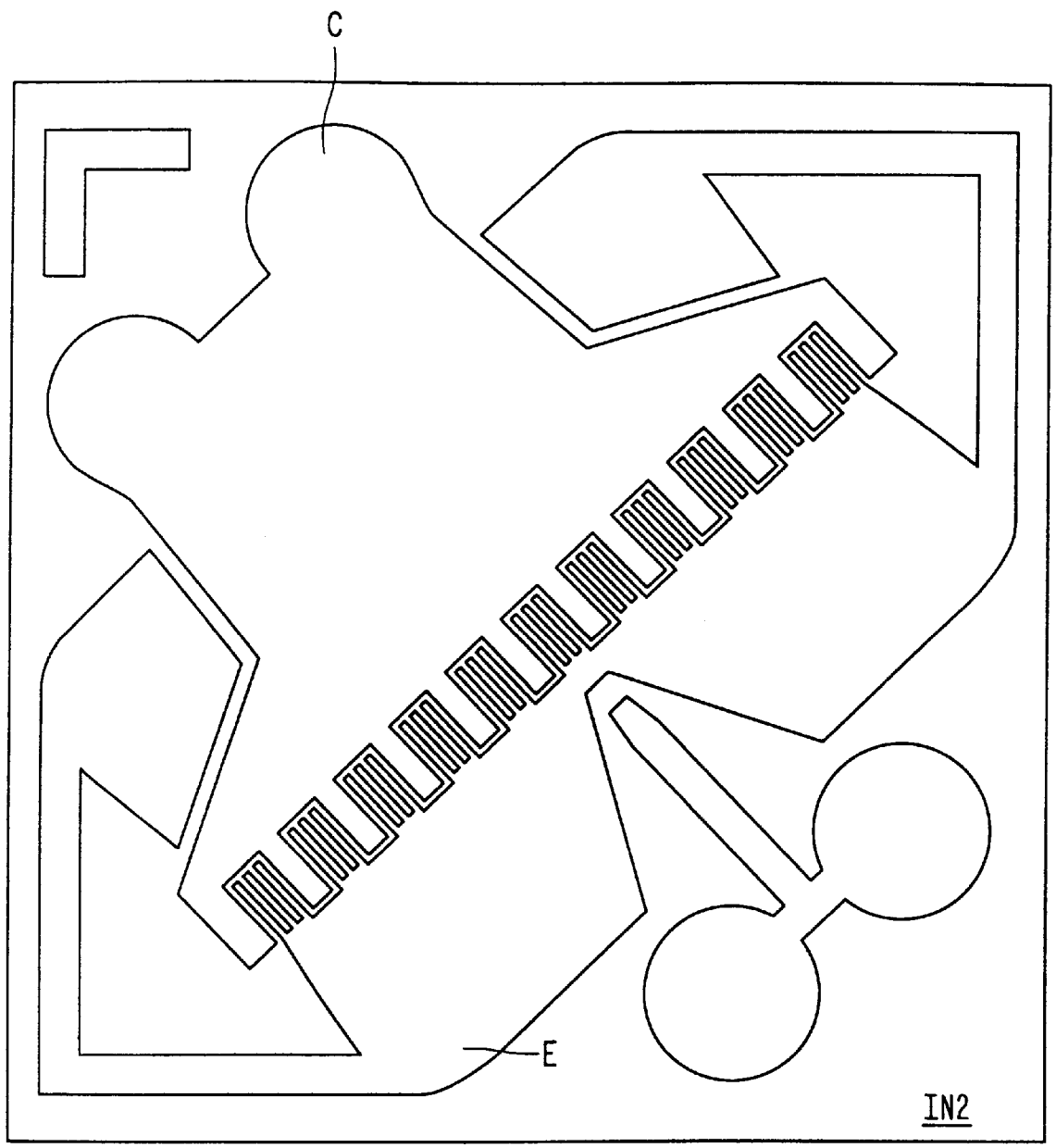
FIG. 11 is a plan view of the pattern of the second metal layer viewed as in FIG. 3.

The semiconductor device according to the invention is provided with a semiconductor substrate 2 with a bipolar transistor having a collector region 3 of a first conductivity type. The substrate 2 in this example has a p-type doping and the collector region 3 an $n^-$-type doping. The collector region is electrically connected by means of a buried $n^+$-type layer 30 and an $n^+$-type connection plug 300. A base region 4 of a second conductivity type opposed to the first, in this example a p-type, is provided such that it adjoins the collector region 3. This base region 4 adjoins the surface 5 in the present example. The base region 4 is provided with an elongate, strongly doped $p^+$-type base contact region 6. The base contact region is split up into a plurality of base contact regions 6 in this example. Adjoining the base region 4, there is an elongate emitter region 7 of the first conductivity type, in this example having an $n^+$-type doping. The emitter region is split up into a plurality of emitter regions 7 in the present example. The split-up base contact regions 6 and emitter regions 7 form so-called fingers. The elongate base contact regions 6 and the elongate emitter regions 7 alternate with one another. The base, collector, and emitter regions are connected to respective connection surfaces B, C and E by means of conductive tracks 10, 11, 110, 12, and 120. The semiconductor device utilizes conductive tracks in two metal layers IN1 and IN2 separated by an insulating dielectric 15. Contact holes, so-called vias, are provided in the dielectric 15 in a number of locations. The metal layers IN1 and IN2 are in direct contact at the areas of the vias. FIG. 3 is a plan view of the entire semiconductor device according to this embodiment, both metal layers IN1 and IN2 being shown. The metal layer IN1 here lies below the metal layer IN2. Conductor tracks in the lower metal layer IN1 are shown in broken lines where they end below the metal layer IN2. Conductor tracks in the upper metal layer IN2 are shown in full lines. In FIG. 3, only the upper metal layer IN2 is drawn in the active region A, i.e. the region indicated with the dotted line A for reasons of clarity. The semiconductor substrate in this example is of a rectangular shape, and the active region A of the transistor formed by the collector, base, and emitter regions 3, 30, 300, 4, 6, and 7 is present along a diagonal of the rectangular substrate. The size of the active region A can be maximized then. The connections of the collector, base, and emitter regions 300, 6, and 7 to the conductor tracks are shown in the detailed plan views of FIGS. 4, 5, and 6. A plan view as in FIG. 3 with only the first metal layer IN1 being drawn is shown in FIG. 9. A plan view as in FIG. 3 with only the intermetal dielectric 15 and the locations of the vias is shown in FIG. 10. FIG. 11 is a plan view as in FIG. 3 with only the second metal layer IN2. FIG. 7 shows how the semiconductor device according to the invention is characterized in that the elongate emitter region 7 has a connection to a connection surface E for a further electrical connection at each of the two ends 70, 77 of the emitter region 7. FIG. 7 shows how in this example an end 70 of the emitter region 7 is connected via a conductive track 11 in the first metal layer IN1. FIG. 3 shows that this conductive track 11 is connected to connection surfaces E1, the conductive tracks 11 being provided in the metal layer IN1, whereas the connection surfaces E1 are provided both in the metal layer IN1 and in the metal layer IN2. FIG. 10 shows the vias provided for this purpose in the intermetal dielectric layer 15. The vias are made so long that the conductor tracks 11, 110 on the emitter region extend farther than the connection of the fingers, i.e. these conductor tracks continue to where the emitter fingers widen, so that the entire conductor track 11, 110 over the emitter region is constructed in two metal layers IN1 and IN2. The connection of the second end 77 runs through conductor track 110 in metal layer IN2 to connection surfaces E2. FIG. 3 shows how the connection surfaces E1 are electrically connected to connection surfaces E2 by means of vias and a by-pass 111 in metal IN1. The collector region 300 is connected via conductor tracks 12 in metal IN2 to connection surfaces C which are present at a same surface side of the semiconductor substrate as the connection surfaces B and E of the base and emitter regions. FIG. 3 shows how the base contact regions 6 are connected to the connection surfaces B via conductor track 10 in metal layer IN1 and a conductor track 10 in metal layer IN2. The semiconductor device is further provided with a covering layer 20 and with contact holes at the areas of the connection surface E, B and C.

Figure 12:
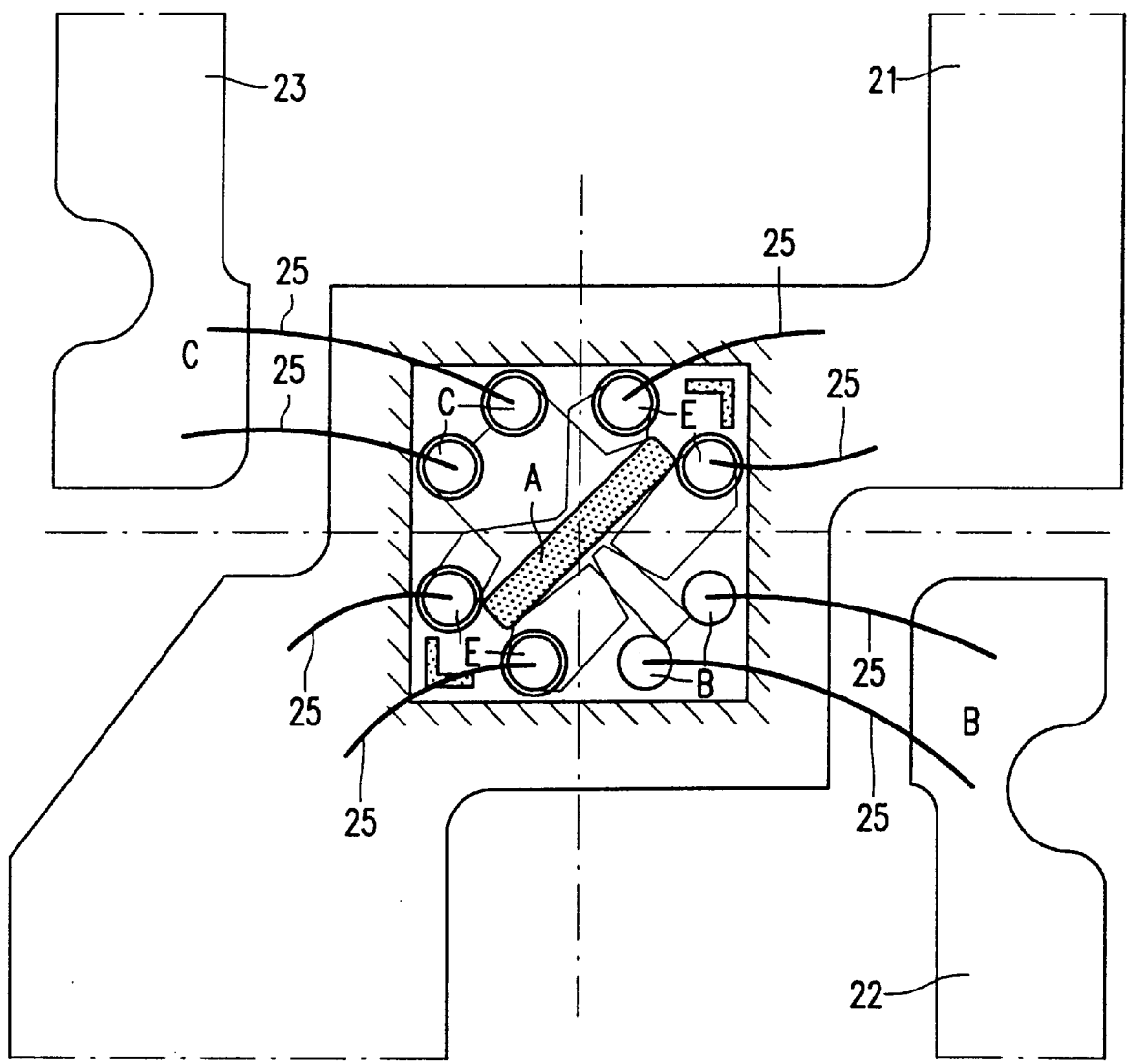
FIG. 12 is a plan view of a semiconductor device according to the invention in which a semiconductor substrate provided with a bipolar transistor is mounted on a lead frame.

The semiconductor device can be mounted on a lead frame. FIG. 12 is a plan view of a semiconductor device according to the invention in which a semiconductor substrate provided with a bipolar transistor is mounted on a lead frame 21, 22, 23. In this example, bonding wires 25 connect the emitter connection surfaces E, base connection surfaces B, and collector connection surfaces C of the bipolar transistor to leads 21, 22, 23 of the lead frame. The semiconductor substrate in this example has a rectangular shape, and an active region A of the transistor formed by the collector, base, and emitter regions is arranged along a diagonal of the rectangular substrate. The connection surfaces E for the emitter region 7 are present on either side of the diagonal. FIGS. 3 and 12 show how comparatively much space is available for these connection surfaces E in the semiconductor device according to the invention. Preferably, three or more connection surfaces E for the emitter region 7 are present, in the present example of a 1000 mW transistor there are four. The four bonding wires 25 provide a low impedance and good high-frequency properties of the electrical connection between connection surfaces E and leads 21 of the lead frame. This number of connection surfaces E is comparatively easy to provide thanks to the diagonal placement of the active region A. More than one connection surface C is present also for the collector region 3, 30, 300, two in this example, so that no problems relating to electromigration in the conductive tracks will occur even in the case of strong collector currents. FIG. 12 shows how two bonding wires 25 may then be used for the collector, so that the transistor performance is not adversely affected by a too high impedance in the collector connection at comparatively strong currents through the collector. The transistor according to this example is built up symmetrically along a diagonal of the rectangular substrate. Such a symmetrical construction of the device is favorable for the thermal stability of the transistor.

The semiconductor device described is manufactured by a standard method in that a p-type silicon substrate 2 (doping $1*10^{18}$ cm$^{-3}$) is provided with an n$^+$ region 30 (doping $1*10^{20}$ cm$^{-3}$) by means of a diffusion process in those locations where the transistors will be provided in a later stage of manufacture. This n$^+$ region 30 will act as a buried layer 30 in the transistor for connecting the collector. An epitaxial n$^-$-type layer 3 (doping $1*10^{16}$ cm$^{-3}$) is provided on the wafer. This layer will act as the collector region 3 in the transistor. A p-type base region 4 (doping $1*10^{18}$ cm$^{-3}$) is provided in this n$^-$-type layer by means of ion implantation. The surface 5 of the substrate 2 is subsequently provided with an insulating layer 27 of silicon oxide in a CVD (Chemical Vapor Deposition) process. Contact holes are then etched into this insulating layer 27 for the manufacture and connection of the respective base, emitter, and collector regions 6, 7, and 300. Then the comparatively deep n$^+$ collector connection plugs 300 (doping $1*10^{19}$ cm$^{-3}$) are provided. P$^+$-type (doping $1*10^{20}$ cm$^{-3}$) base connection regions 6 and n$^+$-type (doping $1*10^{20}$ cm$^{-3}$) emitter regions 7 are provided in the base region 4 by means of ion implantation. A 0.5 $\mu$m thick metal layer IN1 of Al/Si/Cu is provided in a sputtering process and patterned. FIG. 9 shows the pattern of this first metal layer IN1. An insulating layer of silicon oxide 5 (intermetal dielectric) is subsequently provided on the first metal layer IN1 by means of a CVD method. FIG. 10 shows the pattern of contact holes (vias) which is subsequently provided in this layer 15 for making electrical contact between conductor tracks in metal layer IN1 and metal layer IN2. The second, 1.1 $\mu$m thick metal layer IN2 of Al/Si/Cu is subsequently provided on the insulating layer 15 by means of a sputtering process. FIG. 11 shows the pattern which is provided in this second metal layer IN2. The semiconductor device is then provided with an insulating layer 20 of silicon nitride for protection of the device. Contact holes are etched into this layer at the areas of the connection surfaces E, B, and C. Then the substrate 2 is split up into individual semiconductor devices which are mounted each on a lead frame as shown in FIG. 12. The substrate 2 is soldered to lead 21 here. The connection surfaces E, B, and C are provided with bonding wires by a standard method, which wires connect the connection surfaces E, B, and C to the respective leads 21, 22, and 23. The semiconductor device is subsequently enveloped in a standard epoxy resin.

The invention is not limited to the embodiments described above. The embodiment relates to an npn transistor. It is obviously also possible to manufacture a pnp transistor. In the embodiment, several connection surfaces are used for each transistor terminal E, B and C, serving as the connection surfaces E, B, and C. It is alternatively possible to combine several connection surfaces for one transistor terminal into one large connection surface on which several bonding wires can be connected. Such a large connection surface is regarded as equivalent to several separate connection surfaces each designed for one bonding wire or bump. The transistor may be manufactured by various methods which are known per se. Certain techniques for manufacturing the semiconductor device were mentioned above. This is not to say that the semiconductor device according to the invention can only be implemented by such techniques. Thus, for example, an alternative technique such as diffusion from a doped glass or polycrystalline silicon layer may be used instead of ion implantation, while insulating layers may alternatively be provided, for example, in a sputtering process. The layout of the transistor as described in the embodiment provides optimum properties as regards mounting possibilities, heat balance, high-frequency behavior, and an optimum utilization of the available silicon surface area. The exact dimensions of the semiconductor device are not critical. Alternative materials and dopings may be used in the transistor without detracting from the idea at the basis of the invention, thus, for example, the first and second metal layers IN1 and IN2 may very well comprise other materials such as, for example, gold, tungsten, or titanium. It is also possible to use, for example, silicon nitride or silicon oxynitride for the insulating layers. More details on known techniques can be found in handbooks such as S. M. Sze: "VLSI Technology", McGraw-Hill Book Company, and S. Wolf: "Silicon Processing for the VLSI Era", vol. 1, 2, Lattice Press. More details on known semiconductor devices, for example usual doping levels in transistors, can be found in S. M. Sze: "Physics of Semiconductor Devices", McGraw-Hill Book Company.

We claim:

1. A semiconductor device provided with a semiconductor substrate with a bipolar transistor having a collector region of a first conductivity type, a base region adjoining the collector region and of a second conductivity type opposite to the first conductivity type, and a plurality of emitter regions of the first conductivity type each having two longitudinal ends and adjoining the base region, and wherein said collector, base, and emitter regions each being provided with one or more respective, collector, base and emitter conductive tracks connected to one or more respective collector, base and emitter conductive connection surfaces, wherein said one or more emitter conductive tracks on each of the emitter regions are electrically connected to a plurality of emitter conductive connection surfaces for achieving a further electrical connection at each of said two longitudinal ends of each of the emitter regions, and wherein the collector region is connected to at least one of collector conductive connection surfaces which is present at a same side of the semiconductor substrate as at least one of said base conductive connection surfaces and at least one of said emitter conductive connection surfaces.

2. A semiconductor device as claimed in claim 1, wherein the semiconductor substrate is of the same conductivity type as the base region.

3. A semiconductor device as claimed in claim 1, wherein the semiconductor substrate is of rectangular shape, and an active region of the transistor is present along a diagonal of the rectangular substrate.

4. A semiconductor device as claimed in claim 3, wherein three or more emitter conductive connection surfaces for the emitter region are present.

5. A semiconductor device as claimed in claim 1, wherein more than one collector conductive connection surface for the collector region is present.

6. A semiconductor device as claimed in claim 3, wherein the bipolar transistor is built up symmetrically along a diagonal of the rectangular substrate.

7. A semiconductor device as claimed in claim 1, wherein a plurality of collector conductive connection surfaces are present, and three or more emitter conductive connection surfaces for the emitter region are present.

8. A semiconductor device as claimed in claim 1, wherein at least one of said emitter conductive tracks have electrical connection to at least three emitter conductive connection surfaces.

9. A semiconductor device as claimed in claim 1, wherein at least one of said emitter conductor tracks have electrical connection to four emitter conductive connection surfaces.

10. A semiconductor device as claimed in claim 1, wherein said further connection is from bonding wires.

11. A semiconductor device as claimed in claim 1, wherein said further connection comprises bonding wires connecting said emitter conductive connection surfaces to leads of a lead frame upon which the semiconductor device is mounted.

12. A semiconductor device as claimed in claim 1, wherein said further connection comprises bonding wires connecting said emitter conductive connection surfaces to a printed circuit board.

13. A semiconductor device as claimed in claim 1, wherein said base region includes a plurality of elongate base contact regions and each of said emitter regions includes an elongate emitter contact region, wherein said plurality of emitter regions and said plurality of base contact regions form respective finger structures that alternate with each other, and wherein said semiconductor substrate is rectangular in shape.

14. A semiconductor device as claimed in claim 1, wherein said base region includes a plurality of elongate base contact regions, wherein each of said emitter regions includes an elongate emitter contact region, said plurality of emitter regions and said plurality of base contact regions form respective finger structures that alternate with each other, and wherein said semiconductor substrate is rectangular in shape and said bipolar transistor is built up symmetrically along a diagonal of said rectangular shaped substrate.

15. A semiconductor device as claimed in claim 1, wherein said bipolar transistor has a power of approximately 500 mW.

16. A semiconductor device as claimed in claim 1, wherein said bipolar transistor has a power of approximately 1000 mW.

17. A semiconductor device as claimed in claim 1, wherein said first conductivity type is p-type and said second conductivity type is n-type.

18. A semiconductor device as claimed in claim 1, wherein said base region includes a plurality of elongate base contact regions, wherein each of said emitter regions includes an elongate emitter contact region, said plurality of emitter regions and said plurality of base contact regions form respective finger structures that alternate with each other.

* * * * *